(12) United States Patent
Troutman

(10) Patent No.: US 6,768,440 B1
(45) Date of Patent: Jul. 27, 2004

(54) DIGITAL-TO-ANALOG CONVERTERS WITH REDUCED PARASITICS AND ASSOCIATED METHODS

(75) Inventor: Bruce Troutman, Meridian, ID (US)

(73) Assignee: ZiLOG, Inc., San Jose, CA (US)

(*) Notice: Subject to any disclaimer, the term of this patent is extended or adjusted under 35 U.S.C. 154(b) by 0 days.

(21) Appl. No.: 10/402,401

(22) Filed: Mar. 28, 2003

(51) Int. Cl.[7] .............................................. H03M 1/66
(52) U.S. Cl. ........................ 341/150; 341/144; 341/172
(58) Field of Search ................................ 341/150, 144, 341/172

(56) References Cited

U.S. PATENT DOCUMENTS

| | | | |
|---|---|---|---|
| 4,077,035 A | | 2/1978 | Yee |
| 4,616,212 A | | 10/1986 | Law et al. |
| 4,872,011 A | * | 10/1989 | Pelgrom et al. ............ 341/150 |
| 5,021,787 A | * | 6/1991 | Leduc ........................ 341/150 |
| 5,274,376 A | * | 12/1993 | Phillips et al. .............. 341/150 |
| 5,574,457 A | * | 11/1996 | Garrity et al. .............. 341/172 |
| 5,729,232 A | * | 3/1998 | Fujimori ..................... 341/172 |
| 6,217,784 B1 | * | 4/2001 | Thakur et al. ................ 216/57 |
| 6,509,790 B1 | * | 1/2003 | Yang .......................... 327/554 |
| 6,549,155 B1 | * | 4/2003 | Heminger et al. .......... 341/144 |

* cited by examiner

*Primary Examiner*—Jean Bruner Jeanglaude
(74) *Attorney, Agent, or Firm*—O'Keefe, Egan & Peterman, LLP

(57) ABSTRACT

A digital-to-analog converter (DAC) converts a digital signal into an analog signal. The DAC comprises a first capacitor network, a second capacitor network, a first amplifier, and a second amplifier. The first capacitor network includes at least one capacitor that has a weighted capacitance value. Similarly, the second capacitor network includes at least one capacitor that has a weighted capacitance value. The first amplifier has an input that couples to the first capacitor network. The first amplifier also has an output that couples to, and drives, the second capacitor network. The second amplifier has an input that couples to the second capacitor network. The output of the second amplifier constitutes the analog signal.

8 Claims, 5 Drawing Sheets

DIGITAL-TO-ANALOG CONVERTERS WITH REDUCED PARASITICS AND ASSOCIATED METHODS

TECHNICAL FIELD

This patent application relates generally to digital-to-analog converters (DACs) and, more particularly, to DACs with reduced parasitics.

BACKGROUND

DACs have increasingly proliferated in many areas of technology, such as signal processing and control applications. DACs allow system designers to capitalize on the increasing use of digital and signal processing circuitry, such as microcontrollers and microprocessors.

Many control systems accept analog signals as inputs (say, from sensors), and generate analog control outputs. Within the system, however, designers often seek to use digital circuitry and signal processing blocks to take advantage of the flexibility, reliability, standard fabrication, and low cost of such circuitry. DACs allow a control system that uses digital signal and data processing to interface with an analog world, for example, the device that the system seeks to control.

Conventional DACs typically fall into two categories: "R-2R" DACs and weighted-capacitor DACs. R-2R DACs use a resistor ladder as part of their circuitry. The resistor ladder can occupy a relatively large area of the integrated circuitry (IC) within which the DAC resides. Thus, R-2R DACs result in increased area usage within the IC die and, hence, use of additional materials that results in higher costs.

Weighted-capacitor DACs overcome the area penalty of R-2R DACs by using a number of capacitors, rather than resistors. By using capacitors, weighted-capacitor DACs use less area than do R-2R DACs. Some weighted capacitor DACs, however, use a relatively large amount of total capacitance in their capacitor arrays. Consequently, they consume relatively large areas within the ICs in which they reside, thus increasing the cost of the integrated circuit. Furthermore, the weighted capacitors tend to have relatively small values. Consequently, parasitic capacitors (layout parasitic capacitors) within the IC may overwhelm the capacitors and adversely affect the performance of weighted-capacitor DACs. A need exists for weighted-capacitor DACs that are independent of the deleterious effects of layout parasitic capacitances.

SUMMARY

This invention relates to DACs with reduced parasitics and to circuitry that include such DACs. One aspect of the invention relates to apparatus for DACs with reduced parasitics. In one embodiment, a DAC according to the invention includes a first capacitor network and a second capacitor network. Each of the first and second capacitor networks has at least one capacitor that has a weighted capacitance value. The DAC also includes a first amplifier and a second amplifier. An input of the first amplifier couples to the first capacitor network. An output of the first amplifier couples to the second capacitor network. An input of the second amplifier also couples to the second capacitor network.

In another embodiment, a DAC according to the invention includes a first capacitor network and a second capacitor network. Each of the first and second capacitor networks has at least one capacitor that has a weighted capacitance value. The DAC also includes a first amplifier, a second amplifier, and a third amplifier. The first amplifier has an input that couples to the first capacitor network, and an output that couples to an input of the second amplifier. An output of the second amplifier and an input of the third amplifier couple to the second capacitor network.

In another embodiment, a control system according to the invention includes an electrical apparatus and a controller that includes a DAC. The electrical apparatus is configured to be controllable in response to an electrical signal. The controller is configured to supply the electrical signal to the electrical apparatus. The DAC includes a first capacitor network, a second capacitor network, a first amplifier, and a second amplifier. An input of the first amplifier couples to the first capacitor network, whereas an output of the first amplifier couples to the second capacitor network. An input of the second amplifier couples to the second capacitor network. An output of the second amplifier provides the electrical signal to the electrical apparatus.

Another aspect of the invention relates to methods of converting digital signals to analog signals. In one embodiment, a method according to the invention of converting a digital signal to an analog signal includes coupling selectively at least one capacitor in a first capacitor network to one of two voltages in response to a corresponding first set of at least one bit in the digital signal. The method further includes amplifying a signal provided by the first capacitor network to generate an amplified signal, and amplifying the amplified signal to generate a second amplified signal. The method also includes supplying the second amplified signal to a second capacitor network that has at least one capacitor. The method further includes coupling selectively the at least one capacitor in the second capacitor network to one of the two voltages in response to a corresponding second set of at least one bit in the digital signal, and amplifying a second signal provided by the second capacitor network to generate the analog signal.

In another embodiment, a method according to the invention of controlling an electrical apparatus in a control system, where the electrical apparatus is configured to be controllable in response to an electrical signal. The method includes coupling selectively at least one capacitor in a first capacitor network to one of a first voltage and a second voltage in response to a corresponding first set of at least one bit in a digital signal, and amplifying a signal provided by the first capacitor network to generate an amplified signal. The method also includes supplying the amplified signal to a second capacitor network that has at least one capacitor. The method further includes coupling selectively the at least one capacitor in the second capacitor network to one of a second voltage and a third voltage in response to a corresponding second set of at least one bit in the digital, signal. The method also includes amplifying a signal provided by the second capacitor network to generate the electrical signal, and supplying the electrical signal to the electrical apparatus.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates DACs with reduced or eliminated parasitic effects. DACs according to the invention use weighted-capacitor networks. The weighted-capacitor DACs according to the invention may significantly less silicon area on an integrated circuit (IC), while also benefiting from higher accuracy, compared to conventional DACs.

Furthermore, DACs according to the invention overcome the susceptibility of conventional weighted-capacitor DACs to parasitic capacitances. More specifically, DACs according to the invention use virtual ground amplifiers to create a virtual ground that "shorts" the effect of parasitic capacitances. The virtual ground amplifiers may constitute integrating amplifiers, as described below in detail.

Persons of ordinary skill in the art who have the benefit of the description of the invention understand that, in theory, apparatus and methods according to the invention may generate parasitic-free DACs. In other words, using analysis based on ideal components, one may use apparatus and methods according to the invention to reduce to zero the parasitics within a DAC.

In real circuits using non-ideal components, however, apparatus and methods according to the invention may tend to reduce, rather than make zero, the parasitics in DACs. By using techniques in circuit design and layout that persons of ordinary skill in the art with the benefit of the description of the invention understand, one may produce DACs that have relative low parasitics (or parasitics that may approach zero).

Figure 1:
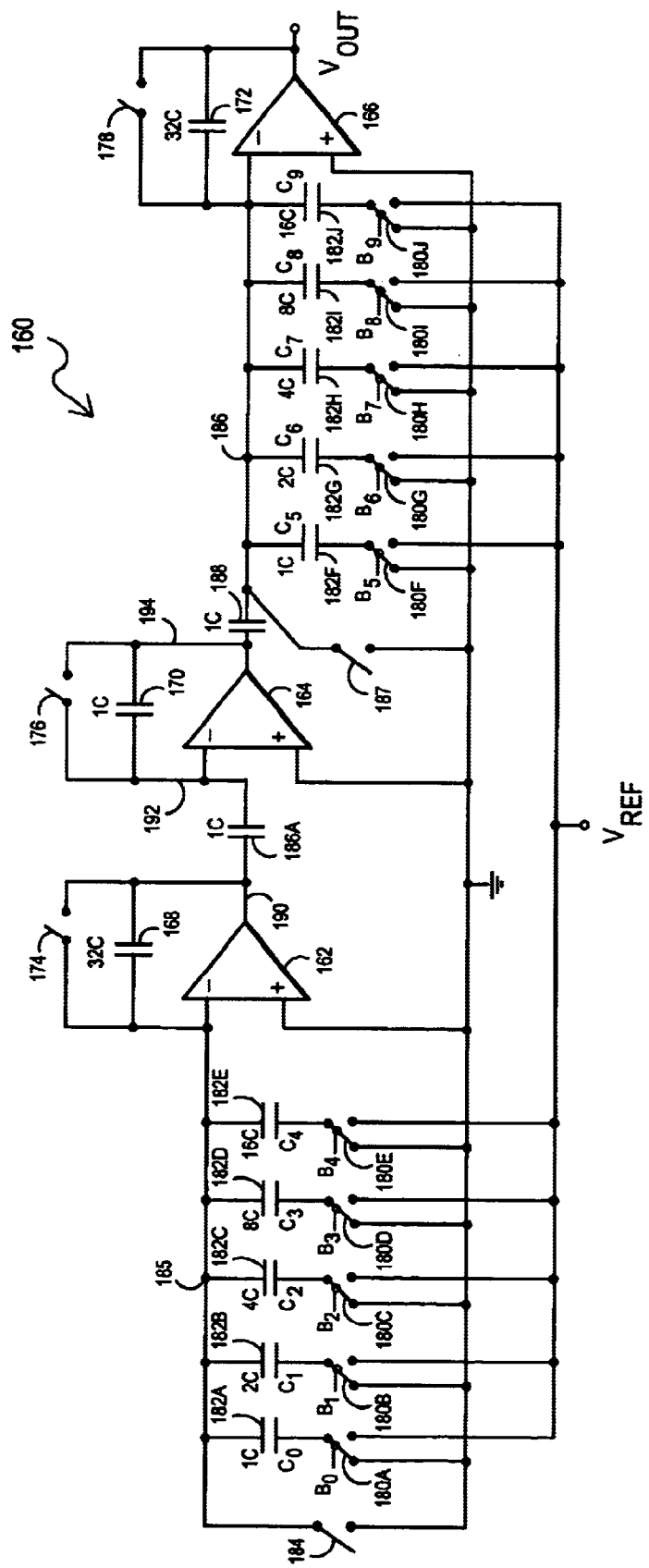
FIG. 1 shows a block diagram of an embodiment of a weighted-capacitor DAC with reduced parasitics according to the invention.

FIG. 1 shows a block diagram of an illustrative embodiment of a weighted-capacitor DAC 160 with reduced parasitics according to the invention. DAC 160 accepts a 10-bit digital input signal, B, that includes bits $B_0$ through $B_9$. As its output, DAC 160 provides analog signal $V_{OUT}$.

DAC 160 includes two capacitor networks: a least-significant bit (LSB) capacitor network, and a most-significant bit (MSB) capacitor network. Each capacitor network array includes one or more capacitors and one or more switches, as described below in detail.

Each of the bits of the digital input signal, B, controls a respective one of switches 180A–180J. Switches 180A–180J constitute single-pole, double-throw (SPDT) switches. In other words, in response to the respective bit in digital input signal, B, each of switches 180A–180J couples a first switch terminal to either a second terminal or a third terminal. For example, when a given bit in input signal, B, has a binary zero value, the respective switch controlled by that bit may couple the first switch terminal to the second switch terminal (which couples to a given potential, such as circuit ground). Conversely, when the bit in input signal, B, has a binary one value, the respective switch may couple the first switch terminal to the third switch terminal (which couples to a reference voltage, $V_{REF}$).

Referring to the embodiment shown in FIG. 1, the LSB capacitor network includes capacitors 182A–182E, and switches 180A–180E. The first switch terminal of each of switches 180A–180E couples to a first terminal of a respective one of capacitors 182A–182E. Each of capacitors 182A–182E has a capacitance expressed as a multiple of a unit capacitance, C. Thus, for example, capacitor 182E has a capacitance of 16C. Note that the capacitance values of capacitors 182A–182E increase in powers of 2. In other words, their capacitance values are, respectively, 1 C, 2C, 4C, 8C, and 16C.

A second terminal of each of capacitors 182A–182E couples to node 185. Switch 184 allows shorting node 185 to a given potential (such as circuit ground), thus initializing the voltage at node 185 to a known voltage level. Depending on the value of a respective bit of the digital input signal B, each of switches 180A–180E couples the first terminal of the respective one of capacitors 182A–182E to either a first potential (such as circuit ground) or to a second potential (such as reference voltage, $V_{REF}$).

The MSB capacitor network in DAC 160 includes capacitors 182F–182J, and switches 180F–180J. The first switch terminal of each of switches 180F–180J couples to a first terminal of a respective one of capacitors 182F–182J. Each of capacitors 182F–182J has a capacitance expressed as a multiple of the unit capacitance, C. Thus, for example, capacitor 182J has a capacitance of 16C. Note that, similar to capacitors 182A–182E in the LSB capacitor network, the capacitance values of capacitors 182F–182J increase in powers of 2.

A second terminal of each of capacitors 182F–182J couples to node 186. Switch 187 allows shorting node 186 to a given potential (such as circuit ground), thus initializing the voltage at node 186 to a known voltage level. Depending on the value of a respective bit of the digital input signal B, each of switches 180F–180J couples the first terminal of the respective one of capacitors 182F–182J to either a first potential (such as circuit ground) or to a second potential (such as reference voltage, $V_{REF}$).

Node 185 drives the inverting input of operational amplifier 162. The output of operational amplifier 162 drives its inverting input through capacitor 168, which has a capacitance value of 32C. In other words, operational amplifier 162, together with capacitor 168, acts as an integrating amplifier. Switch 174 allows shorting capacitor 168, thus initializing the voltage across capacitor 168 to a known voltage level (zero).

The output of operational amplifier 162 drives the inverting input of operational amplifier 164 through capacitor 186A. Capacitor 186A has a capacitance value of 1C. The output of operational amplifier 164 feeds back to its inverting input through capacitor 170 (capacitor 170 has a capacitance value of 1C). Consequently, operational amplifier 164, in combination with capacitor 170, acts as an integrating amplifier. Switch 176 allows shorting capacitor 170, thus initializing the voltage across capacitor 170 to a known voltage level (zero). The output of operational amplifier 164 drives node 186 through capacitor 188. Capacitance 188 has a capacitance value of 1C.

Node 186 drives the inverting input of operational amplifier 166. The output of operational amplifier 166 drives its inverting input through capacitor 172 (which has a capacitance value of 32C). In other words, operational amplifier 166, together with capacitor 172, acts as an integrating amplifier. Switch 178 allows shorting capacitor 172, thus initializing the voltage across capacitor 172 to a known voltage level (zero). The output voltage of operational amplifier 166, $V_{OUT}$, constitutes the output analog voltage of DAC 160.

DAC 160 eliminates, or tends to reduce, the effects of parasitic capacitances present between node 185 and circuit ground. Negative feedback around operational amplifier 162 provides a "virtual ground" at its inverting input. In other words, negative feedback, combined with the relatively high open-loop gain of operational amplifier 162, forces to nearly zero the voltage differential between the inverting input and the non-inverting input of operational amplifier 162.

Note that the non-inverting input of operational amplifier 162 couples to circuit ground. Consequently, negative feedback forces the voltage at node 185 (the voltage at the inverting input of operational amplifier 162) to nearly zero (circuit ground potential). Any parasitic capacitance present between node 185 and circuit ground will have a nearly zero voltage across it. Effectively, negative feedback around operational amplifier 162 shorts the parasitic capacitance at node 185 to circuit ground. As a result, the current through the parasitic capacitance and, hence, its effect on the operation of DAC 160 becomes negligible.

Note that operational amplifier 162 causes a sign inversion. In other words, the polarity of the output voltage of operational amplifier 162 is the opposite of the polarity of the input voltage at its inverting input, or the voltage at node 185 (i.e., a 180° phase difference exists between the two voltages). To ensure proper operation of DAC 160, operational amplifier 164 provides a second sign inversion. Put another way, the voltage at the output of operational amplifier 164 has the same polarity as the voltage at the inverting input of operational amplifier 162, or the voltage at node 185 (two sign inversions result in a 0° phase difference between the two voltages).

Note that, rather than using capacitors, one may implement a sign inversion using a variety of other techniques, for example, by using resistors. The modifications to DAC 160 to use such implementations falls within the knowledge of persons of ordinary skill in the art who have the benefit of the description of the invention.

Similarly, DAC 160 eliminates, or tends to reduce, the effects of parasitic capacitances present between node 186 and ground. Similar to operational amplifier 162, negative feedback around operational amplifier 166 provides a "virtual ground" at its inverting input. Because the non-inverting input of operational amplifier 166 couples to circuit ground, negative feedback forces the voltage at node 186 (the voltage at the inverting input of operational amplifier 166) to nearly zero (circuit ground potential).

As a consequence of the virtual ground, any parasitic capacitance present between node 186 and circuit ground will have a nearly zero voltage across it. In other words, the virtual ground present at the inverting input of operational amplifier 166 shorts the parasitic capacitance at node 186 to circuit ground. Consequently, the current through the parasitic capacitance and, hence, its effect on the operation of DAC 160 becomes negligible.

In addition to the reduction or elimination of parasitic capacitances at node 185 and 186, DAC 160 has another advantage over conventional capacitor DACs. Conventional capacitor DACs typically use relatively large amounts of capacitance. Expressed in units of capacitance, C, conventional 10-bit DACs may use as much as 1,024C. DAC 160, however, uses a total capacitance of 129C. Because of the lower total capacitance used, DAC 160 helps to reduce the chip area of an IC that includes DAC 160 and, hence, lower the costs of manufacturing the IC.

One may obtain the relationship between the output voltage, $V_{OUT}$, and the digital input signal, B, using the principle of superposition, as follows. Because of the virtual ground at node 185, the state (i.e., the binary value) of bits $B_0$ through $B_4$ forces a current through appropriate ones of capacitors 182A–182E to node 185. Over a time factor or period, T, one may express the current flowing to node 185, or $I_{LSB}$, as:

$$I_{LSB} = \left( \frac{V_{REF}}{T} \sum_{j=0}^{4} B_j C_j \right),$$

where $B_j$ denotes a respective one of bits 0 through 4 in the digital input signal, B, and $C_j$ represents a respective one of capacitors 182A–182E ($C_0$–$C_4$).

Similarly, because of the virtual ground at node 186, the state of bits $B_5$ through $B_9$ forces a current through appropriate ones of capacitors 182F–182J to node 186. Accordingly, one may express the current flowing into node 186, or $I_{MSB}$, as:

$$I_{MSB} = \left( \frac{V_{REF}}{T} \sum_{j=5}^{9} B_j C_j \right),$$

where $B_j$ denotes a respective one of bits 5 through 9 in the digital input signal, B, and $C_j$ represents a respective one of capacitors 182F–182J ($C_5$–$C_9$).

Applying Kirchoff's current law to node 190 (i.e., to the output of operational amplifier 162), one obtains:

$$\frac{32 C V_{LSB2}}{T} = -I_{LSB}.$$

Substituting for $I_{LSB}$, one may write:

$$\frac{32 C V_{LSB2}}{T} = -\left( \frac{V_{REF}}{T} \left( \sum_{j=0}^{4} B_j C_j \right) \right), \quad \text{or}$$

$$V_{LSB2} = -\frac{V_{REF}}{32C} \left( \sum_{j=0}^{4} B_j C_j \right),$$

where $V_{LSB_2}$ denotes the voltage at node 190.

Similarly, summing the currents flowing into node 192 (i.e., the inverting input of operational amplifier 164, one may write:

$$\frac{C V_{LSB4}}{T} = -I_{LSB2},$$

where $V_{LSB_4}$ denotes the voltage at node 194 (i.e., the output of operational amplifier 164), or $$\frac{C V_{LSB4}}{T} = -\left( \frac{C V_{LSB2}}{T} \right),$$

$$\frac{C V_{LSB4}}{T} = \left( \frac{C}{T} \right) \left( \frac{V_{REF}}{32C} \left( \sum_{j=0}^{4} B_j C_j \right) \right), \quad \text{and finally,}$$

$$V_{LSB4} = +\left( \frac{V_{REF}}{32C} \left( \sum_{j=0}^{4} B_j C_j \right) \right).$$

and finally,

Denoting the current through capacitor 188 as $I_{LSB_4}$ one may write:

$$-\frac{32CV_{OUT}}{T} = I_{LSB4} + I_{MSB},$$

$$-\frac{32CV_{OUT}}{T} = \left(\frac{CV_{REF}}{32CT}\left(\sum_{j=0}^{4} B_j C_j\right)\right) + \left(\frac{V_{REF}}{T}\left(\sum_{j=5}^{9} B_j C_j\right)\right), \text{ or}$$

$$-\frac{32CV_{OUT}}{T} = \left(\frac{V_{REF}}{32T}\left(\sum_{j=0}^{4} B_j C_j\right)\right) + \left(\frac{V_{REF}}{T}\left(\sum_{j=5}^{9} B_j C_j\right)\right).$$

Solving for the analog output voltage, $V_{OUT}$, of DAC 160, one obtains:

$$V_{OUT} = -\frac{V_{REF}}{32C}\left(\left(\frac{1}{32}\sum_{j=0}^{4} B_j C_j\right) + \sum_{j=5}^{9} B_j C_j\right).$$

One may reduce the total capacitance value used by DAC 160. From a review of the above equations, one may obtain a relationship between the capacitance values of capacitor 168 and capacitor 170. Persons of ordinary skill in the art who have the benefit of the description of the invention will appreciate that one may write:

$$C_{168} \times C_{170} = 32C^2,$$

where $C_{168}$ and $C_{170}$ represent, respectively, the capacitance values of capacitor 168 and capacitor 170.

Figure 2:
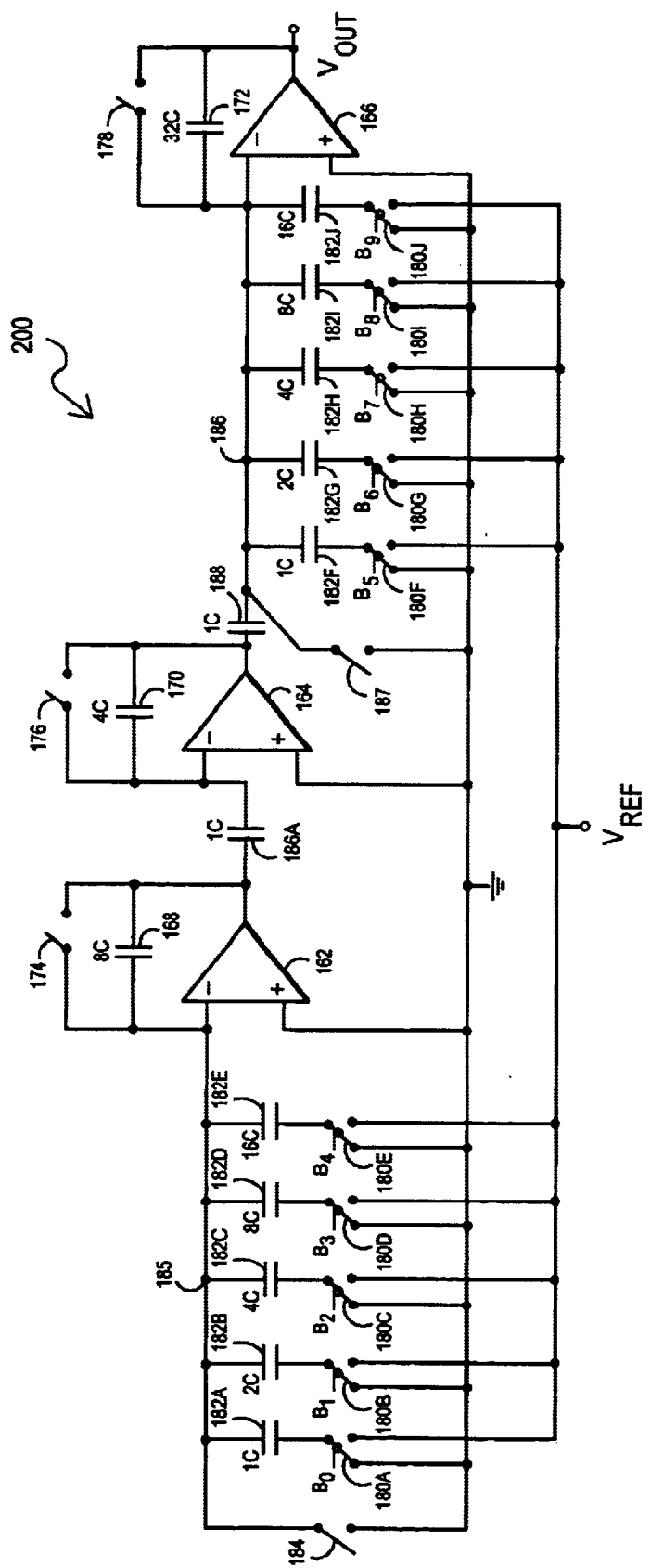
FIG. 2 illustrates a block diagram of another embodiment of a weighted-capacitor DAC with reduced parasitics according to the invention.

Using the equation above, one may change the values of capacitor 168 and capacitor 170, as desired (as long as, of course, the capacitance values satisfy the equation above. FIG. 2 shows a block diagram of an illustrative embodiment of a weighted-capacitor DAC 200 with reduced parasitics according to the invention, with a reduced capacitance value of capacitor 168.

Specifically, capacitor 168 has a capacitance value of 8C, whereas capacitor 170 has a capacitor value of 4C. Note that the product of the capacitance values of capacitor 168 and capacitor 170 equals $32C^2$ (i.e., $8C \times 4C = 32C^2$). Note further that the specific capacitance values of capacitor 168 and capacitor 170 (i.e., 8C and 4C, respectively), constitute only exemplary or illustrative values. As persons of ordinary skill in the art with the benefit of the description of the invention appreciate, one may use other choices of capacitance values for capacitor 168 and capacitor 170, as desired.

DAC 200 includes similar components as does DAC 160 in FIG. 1. (Note, of course, that capacitance values of capacitor 168 and capacitor 170 differ between DAC 160 and DAC 200, as described above.) Furthermore, DAC 200 operates in a similar manner as does DAC 160. Using an analysis similar to the analysis above, one may show that in DAC 200:

$$V_{OUT} = -\frac{V_{REF}}{32C}\left(\left(\frac{1}{32}\sum_{j=0}^{4} B_j C_j\right) + \sum_{j=5}^{9} B_j C_j\right).$$

Note that DAC 160 (see FIG. 1) and DAC 200 (see FIG. 2) use one reference voltage, $+V_{REF}$. If one uses a DAC according to the invention in a circuit that includes both polarities of a voltage reference (i.e., both $+V_{REF}$ and $-V_{REF}$), one may eliminate one of amplifiers 162 or 164 in DACs 160 and 270.

Figure 3:
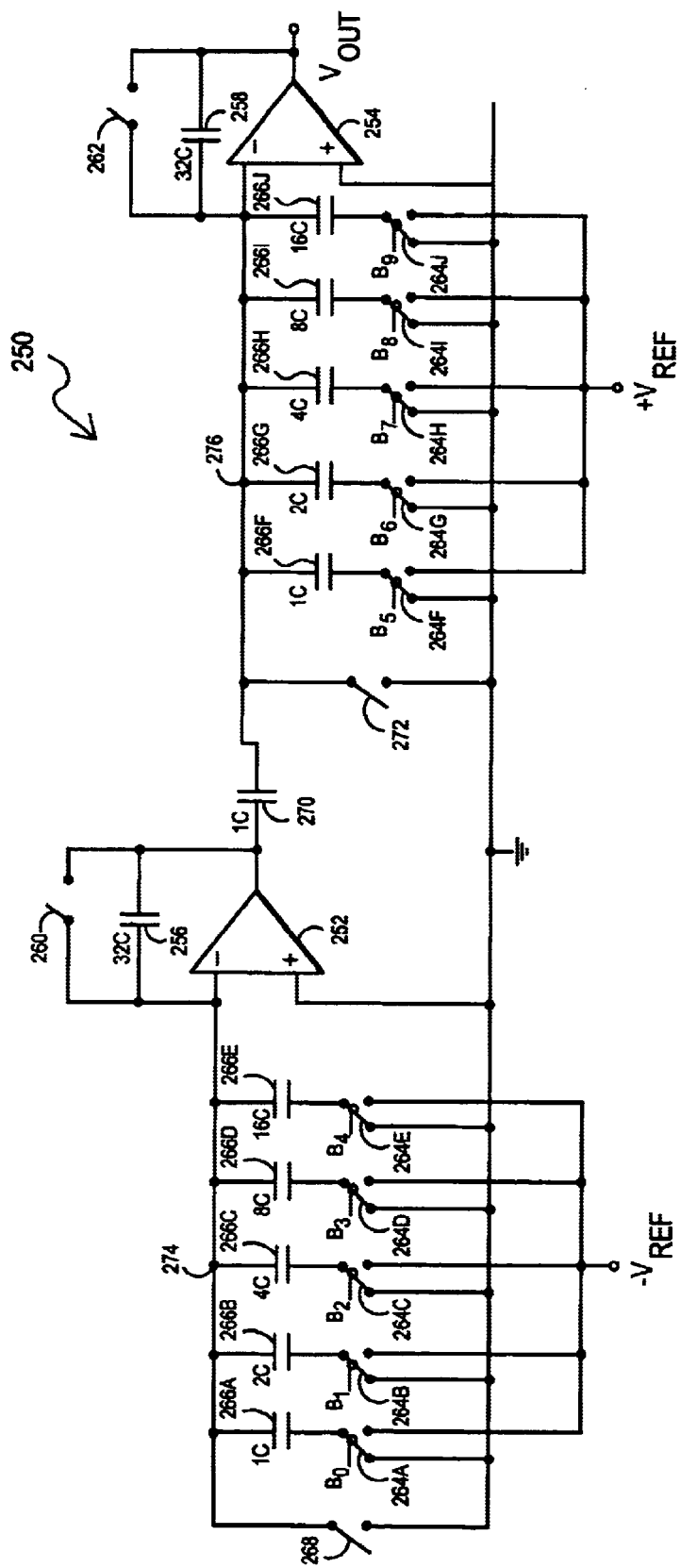
FIG. 3 depicts a block diagram of an additional embodiment of a weighted-capacitor DAC with reduced parasitics according to the invention.

FIG. 3 depicts a block diagram of an additional embodiment of a weighted-capacitor DAC 200 with reduced parasitics according to the invention. DAC 200 uses both $+V_{REF}$ and $-V_{REF}$ and, therefore uses one fewer amplifier than do DACs 160 and 200. DAC 200 accepts a 10-bit digital input signal, B, that includes bits $B_0$ through $B_9$. As its output, DAC 200 provides analog signal $V_{OUT}$.

Similar to DACs 160 and 200, DAC 160 has two capacitor networks: a least-significant bit (LSB) capacitor network, and a most-significant bit (MSB) capacitor network. Each capacitor network array includes one or more capacitors and one or more switches, as described below in detail. The LSB capacitor network couples to the $-V_{REF}$ reference voltage, whereas the MSB capacitor network couples to the $+V_{REF}$ reference voltage. Note that one may use the reverse arrangement, as desired. In other words, one may use a DAC in which the LSB capacitor network couples to the $+V_{REF}$ reference voltage and the MSB capacitor network couples to the $-V_{REF}$ reference voltage.

Each of the bits of the digital input signal, B, controls a respective one of switches 264A–264J. Switches 264A–264J are of the single-pole, double-throw (SPDT) type. Put another way, in response to the respective bit in digital input signal, B, each of the switches couples a first switch terminal to either a second terminal or a third terminal. For example, when a given bit in input signal, B, has a binary zero value, the respective switch controlled by that bit may couple the first switch terminal to the second switch terminal (which couples to a given potential, such as circuit ground). Conversely, when the bit in input signal, B, has a binary one value, the respective switch may couple the first switch terminal to the third switch terminal (which couples to one of the reference voltages).

Referring to FIG. 3, the LSB capacitor network includes capacitors 266A–266E, and switches 264A–264E. The first switch terminal of each of switches 264A–264E couples to a first terminal of a respective one of capacitors 264A–264E. Each of capacitors 266A–266E has a capacitance expressed as a multiple of a unit capacitance, C, as described above with respect to DACs 160 and 200. Note that, similar to DACs 160 and 200, the capacitance values of capacitors 266A–266E increase in powers of 2 (thus, they have capacitance values of, respectively, 1C, 2C, 4C, 8C, and 16C).

A second terminal of each of capacitors 266A–266E couples to node 274. Switch 268 allows coupling node 274 to a given potential (such as circuit ground) to initialize the voltage at node 274 to a known voltage level. Depending on the value of a respective bit of the digital input signal B, each of switches 264A–264E couples the first terminal of the respective one of capacitors 266A–266E to either a first potential (such as circuit ground) or to a second potential (such as one of the reference voltages).

Similar to the LSB capacitor network, the MSB capacitor network in DAC 250 includes capacitors 266F–266J, and switches 264F–264J. The first switch terminal of each of switches 264F–264J couples to a first terminal of a respective one of capacitors 266F–266J. Each of capacitors 266F–266J has a capacitance expressed as a multiple of the unit capacitance, C, and those capacitance values increase in powers of two, as described above with respect to the LSB capacitor network.

Similar to DACs 160 and 200, a second terminal of each of capacitors 266F–266J couples to node 276. Switch 272 allows shorting or coupling node 276 to a given potential (such as circuit ground), thus initializing the voltage at that node to a known voltage level. Depending on the value of a respective bit of the digital input signal B, each of switches 264F–264J couples the first terminal of the respective one of capacitors 266F–266J to either a first potential (such as circuit ground) or to a second potential (such as one of the reference voltages).

Node 274 drives the inverting input of operational amplifier 252. The output of operational amplifier 252 drives its inverting input through capacitor 256, which has a capacitance value of 32C. Thus, operational amplifier 252, together with capacitor 256, forms an integrating amplifier. Switch 260 allows shorting capacitor 256, thus initializing the voltage across capacitor 256 to a known voltage level (zero). The output of operational amplifier 252 drives node 276 through capacitor 270, which has a capacitance value of 1C.

Node 276 drives the inverting input of operational amplifier 254. The output of that amplifier drives its inverting input through capacitor 258 (which has a capacitance value of 32C). In other words, operational amplifier 254, together with capacitor 258, forms an integrating amplifier. Switch 262 allows shorting capacitor 258, thus initializing the voltage across capacitor 258 to a known voltage level (zero).

Similar to DACs 160 and 200, DAC 250 eliminates, or tends to reduce, the effects of parasitic capacitances present between node 274 and circuit ground because of negative feedback around operational amplifier 252. In other words, negative feedback, combined with the relatively high open-loop gain of operational amplifier 252, forces to nearly zero the voltage differential between the inverting input and the non-inverting input of operational amplifier 252.

As described above, effectively, negative feedback around operational amplifier 252 shorts the parasitic capacitance at node 274 to circuit ground. As a result, the current through the parasitic capacitance and, hence, its effect on the operation of DAC 250 becomes negligible. Note that because the LSB capacitor network uses a negative reference voltage, one need not use a second operational amplifier (i.e., one need not cause a sign inversion).

Similarly, DAC 250 eliminates, or tends to reduce, the effects of parasitic capacitances present between node 276 and ground. Similar to operational amplifier 252, negative feedback around operational amplifier 254 provides a "virtual ground" at its inverting input. Because the non-inverting input of operational amplifier 254 couples to circuit ground, negative feedback forces the voltage at node 276 (the voltage at the inverting input of operational amplifier 254) to nearly zero (circuit ground potential).

As a consequence of the virtual ground, any parasitic capacitance present between node 276 and circuit ground will have a nearly zero voltage across it. In other words, the virtual ground present at the inverting input of operational amplifier 254 shorts the parasitic capacitance at node 276 to circuit ground. Consequently, the current through the parasitic capacitance and, hence, its effect on the operation of DAC 250 becomes negligible. Note that DAC 250 has the same advantages over conventional DACs, as described above with respect to DAC 160 and DAC 200 (e.g., reduced capacitance values, lower chip area, lower manufacturing cost, and higher reliability).

The output voltage of operational amplifier 254, $V_{OUT}$, constitutes the output analog voltage of DAC 250. Using a similar analysis as described above in connection with DAC 160, one may write the output voltage in terms of various circuit parameters as follows:

$$V_{OUT} = -\frac{V_{REF}}{32C}\left[\left(\frac{1}{32}\sum_{j=0}^{4} B_j C_j\right) + \sum_{j=5}^{9} B_j C_j\right].$$

Figure 4:
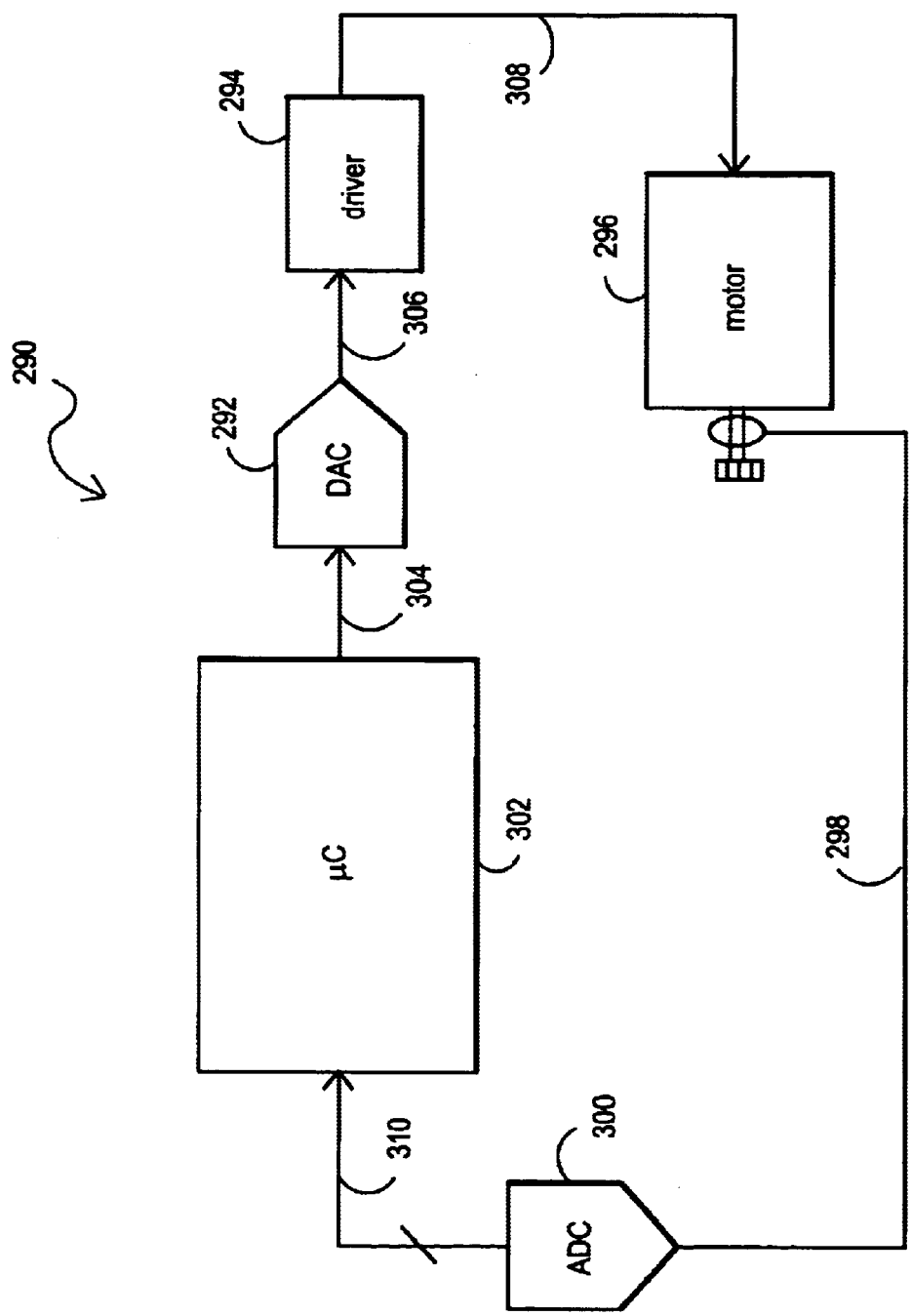
FIG. 4 shows a block diagram of an embodiment of a control system that uses a weighted-capacitor DAC with reduced parasitics according to the invention.

One may use the DACs according to the invention in a variety of applications, such as control systems, for example, motor control systems. FIG. 4 shows a block diagram of an embodiment of a control system 290 that uses a weighted-capacitor DAC 292 with reduced parasitics according to the invention. DAC 292 may constitute any of DACs 160, 200, and 250, as desired.

Control system 290 includes a motor 296. Control system 290 may control various aspects of the operation of motor 296, such as its speed, as measured and denoted by signal 298. Analog-to-digital converter (ADC) 300 accepts signal 298 and converts it to a digital signal 310. Digital signal 310 feeds an input of a microcontroller 302. Note that, as persons of ordinary skill in the art who have the benefit of the description of the invention understand, one may use a variety of circuitry to accomplish the same task as microcontroller 302. For example, one may use a microprocessor, a computer, and the like, as desired.

Microcontroller 302 implements a control loop by driving the error between the actual and desired speed of motor 296 towards zero. In other words, microcontroller 302 compares signal 310 to a signal (not shown explicitly) that denotes the desired speed of motor 296 to generate an error signal 304. DAC 292 converts error signal 304 to analog signal 306. Analog signal 306 feeds an input of motor driver 294. Driver 294 uses analog signal 306 to generate drive signal 308. Drive signal 308 drives motor 296.

Figure 5:
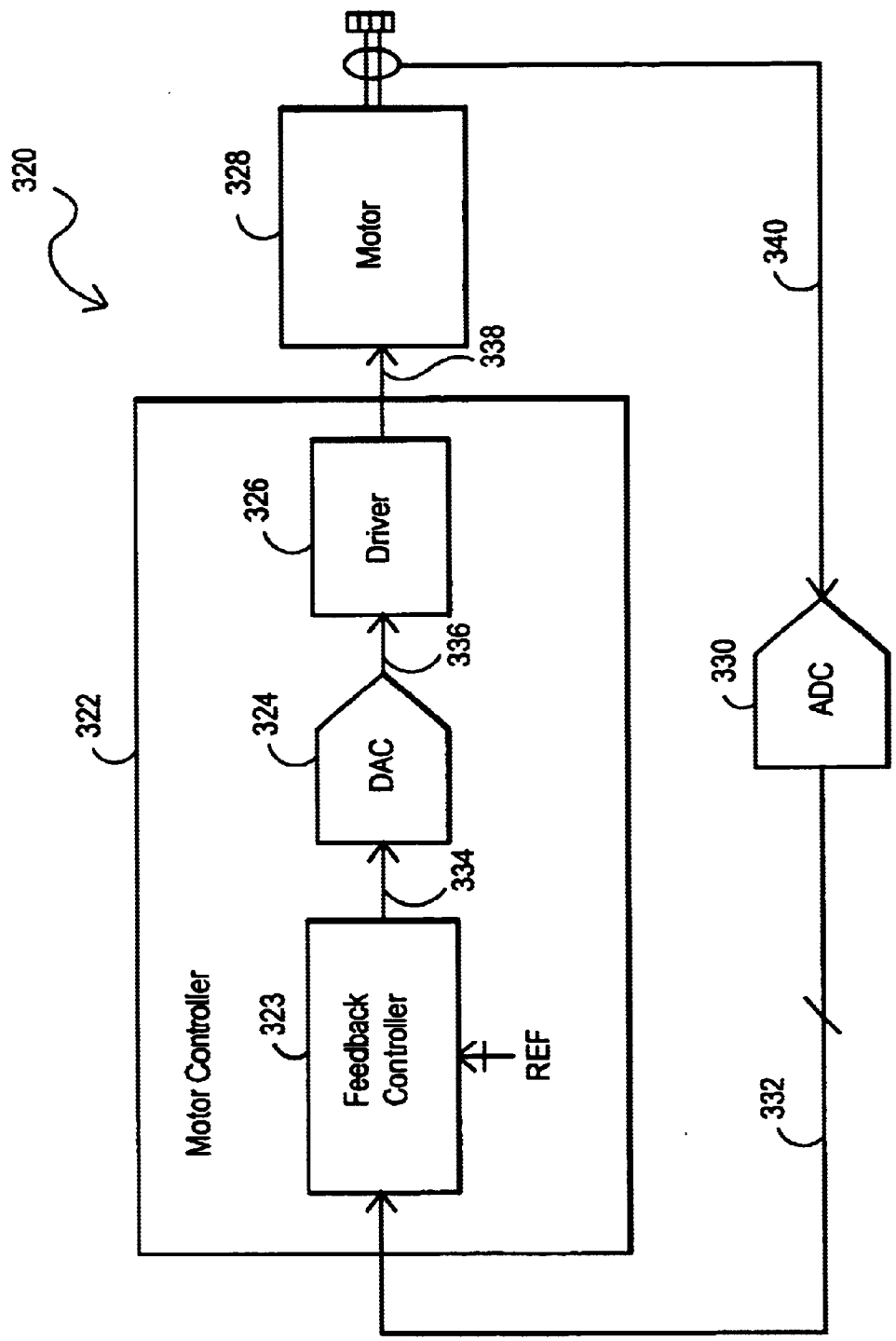
FIG. 5 illustrates a block diagram of another embodiment of a control system that includes a weighted-capacitor DAC with reduced parasitics according to the invention.

FIG. 5 illustrates a block diagram of another embodiment of a control system 320 that includes a weighted-capacitor DAC 324 with reduced parasitics according to the invention. DAC 324 may constitute any of DACs 160, 200, and 250, as desired.

Similar to control system 290 (see FIG. 4), control system 320 includes a motor 328. Control system 320 may control various aspects of the operation of motor 328, such as its speed, as measured and denoted by signal 340. Analog-to-digital converter (ADC) 330 accepts signal 298 and converts it to a digital signal 332. Digital signal 332 feeds an input of a motor controller 322.

Motor controller 322 includes a feedback controller 323, a DAC 324, and motor driver 326. Generally, as persons of ordinary skill in the art who have the benefit of the description of the invention understand, one may use a variety of circuitry to accomplish the same task as microcontroller 302. As one example, motor controller 322 may constitute an integrated motor controller, as desired. Alternatively, one may implement motor controller 322 in a variety of ways, for example, by combinations of discrete components, integrated circuits, and/or modules, as desired.

Feedback controller 323 compares digital signal 332 with a reference signal denoted as REF. Signal REF may constitute a reference or desired attribute of operation of motor 328, for example, its speed. As a result of the comparison, feedback controller 323 produces signal 334. DAC 324 converts signal 334 into analog signal 336. DAC 324 may constitute any of the DACs 160, 200, and 250, described above, as desired.

Analog signal 336 feeds an input of motor driver 326. Driver 326 uses analog signal 336 to generate drive signal 338. Drive signal 338 drives motor 328. As a result of the operation of motor 328, signal 340 feeds ADC 330, and the whole cycle repeats. Thus, control system 320 constitutes a negative feedback control system, as persons skilled in the art with the benefit of the description of the invention understand.

Referring to the various illustrative embodiments of DACs according to the invention as described here, note that the architectures shown and described correspond to 10-bit DACs. One, however, may apply the inventive concepts to DACs having virtually any desired resolution by making modifications to the embodiments shown and described. Those modifications fall within the knowledge of persons of ordinary skill in the art who have the benefit of the description of the invention.

Furthermore, note that the capacitor values shown and described constitute illustrative or exemplary values. One may design a wide variety of DACs according to the invention that use other capacitance values, as desired. Also, the embodiments shown use operational amplifiers, although one may modify the circuitry shown and described to produce various embodiments according to the invention that use other components or circuitry, such as difference amplifiers, operational transconductance amplifiers, and the like. Those modifications fall within the knowledge of persons of ordinary skill in the art who have the benefit of the description of the invention. Moreover, FIGS. 4 and 5 refer to motor control systems, but as persons skilled in the art with the benefit of the description of the invention understand, one may apply the inventive concepts effective to other control systems, as desired.

Referring to the accompanying drawings, the various blocks shown in some of the drawings depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have read the disclosure of the invention will understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and arc to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

I claim:

1. A digital-to-analog converter (DAC), comprising:
   a first capacitor network, the first capacitor network including at least one capacitor having a weighted capacitance value;
   a first amplifier, the first amplifier including a first input coupled to the first capacitor network, the first amplifier further including an output;
   a second amplifier, the second amplifier including a first input coupled to the output of the first amplifier, the second amplifier further including an output;
   a second capacitor network coupled to the output of the second amplifier, the second capacitor network including at least one capacitor having a weighted capacitance value; and
   a third amplifier, the third amplifier including a first input coupled to the second capacitor network.

2. The digital-to-analog converter (DAC) of claim 1, wherein the first capacitor network comprises at least one first switch, each of the at least one first switch coupled to a corresponding one of the at least one capacitor in the first capacitor network, and wherein the second capacitor network comprises at least one second switch, each of the at least one second switch coupled to a corresponding one of the at least one capacitor in the second capacitor network.

3. The digital-to-analog converter (DAC) of claim 2, wherein each of the at least one first switch is configured to respond to a corresponding bit in a first set of at least one bit in a digital input signal, each of the at least one first switch further configured to selectively couple one terminal of the corresponding one of the at least one capacitor in the first capacitor network to a first voltage and a second voltage.

4. The digital-to-analog converter (DAC) of claim 3, wherein each of the at least one second switch is configured to respond to a corresponding bit in a second set of at least one bit in the digital input signal, each of the at least one first switch further configured to selectively couple one terminal of the corresponding one of the at least one capacitor in the second capacitor network to the first and second voltages.

5. The digital-to-analog converter (DAC) of claim 4, wherein each of the first, second, and third amplifiers comprises an integrating amplifier, and wherein each of the first, second, and third amplifiers is further configured as a virtual ground amplifier.

6. The digital-to-analog converter (DAC) of claim 5, wherein a second terminal of the at least one capacitor in the first capacitor network couples to the first input of the first amplifier.

7. The digital-to-analog converter (DAC) of claim 6, wherein a second terminal of the at least one capacitor in the second capacitor network couples to the first input of the third amplifier.

8. The digital-to-analog converter (DAC) of claim 7, wherein the first voltage comprises a ground potential, and wherein the second voltage comprises a reference voltage.

* * * * *